(12) United States Patent
Ooi

(10) Patent No.: US 8,019,297 B2
(45) Date of Patent: Sep. 13, 2011

(54) RADIO RECEIVER, AUDIO SYSTEM, AND METHOD OF MANUFACTURING RADIO RECEIVER

(75) Inventor: Yasushi Ooi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 431 days.

(21) Appl. No.: 12/314,831

(22) Filed: Dec. 17, 2008

(65) Prior Publication Data
US 2009/0163159 A1 Jun. 25, 2009

(30) Foreign Application Priority Data

Dec. 21, 2007 (JP) ................................ 2007-329728

(51) Int. Cl.
*H03D 7/16* (2006.01)
(52) U.S. Cl. ...................................... 455/131; 455/323
(58) Field of Classification Search .................. 455/131, 455/130, 139, 313, 323
See application file for complete search history.

(56) References Cited

U.S. PATENT DOCUMENTS

| 6,397,048 | B1 * | 5/2002 | Toda ............................. | 455/131 |
| 7,272,368 | B2 * | 9/2007 | Devaney et al. ............. | 455/130 |
| 7,599,678 | B2 * | 10/2009 | Fisher ........................... | 455/323 |
| 7,778,613 | B2 * | 8/2010 | Seendripu et al. ........... | 455/130 |
| 2007/0129041 | A1 | 6/2007 | Yokoyama et al. | |

FOREIGN PATENT DOCUMENTS

| JP | 7-202737 (A) | 8/1995 |
| JP | 9-93149 | 4/1997 |
| JP | 2003-218715 (A) | 7/2003 |
| JP | 2003-244002 (A) | 8/2003 |
| JP | 2007-158583 (A) | 6/2007 |

OTHER PUBLICATIONS

"Symphony Digital Radio Introduction", Product Review, pp. 18 and 26, Freescale Semiconductor, Inc., SYMPHONYCHPSET/D Rev.0, Jan. 2003.
"SAF7730HV", Phillips Semiconductors, Car Stereo Designer's Guide 2004/2005, Order # 9397 750 13849, p. 29, Sep. 2004.
"TDA7580" Data Sheet, STMicroelectronics, Mar. 2007.
Notice of Reason(s) for Rejection dated Jul. 5, 2011, with English translation.

* cited by examiner

*Primary Examiner* — Hai L Nguyen
(74) *Attorney, Agent, or Firm* — McGinn IP Law Group, PLLC

(57) ABSTRACT

A radio receiver includes a frequency converter, an oscillation circuit, an A/D converter, and a digital demodulator. The A/D converter digitally samples the intermediate frequency signal by using one of an oscillating frequency, a multiplying frequency, and a dividing frequency of the clock signal as a sampling frequency. The digital demodulator performs a digital demodulation processing by using the intermediate frequency signal digitally sampled and by using the one of the oscillating frequency, the multiplying frequency, and the dividing frequency of the clock signal as an operating frequency. The oscillating frequency is within a predetermined range. The predetermined range is at least one of equal to or more than 37.1 MHz and less than or equal to 37.9 MHz, equal to or more than 54.1 MHz and less than or equal to 64.8 MHz, and equal to or more than 74.2 MHz and less than or equal to 75.8 MHz.

13 Claims, 8 Drawing Sheets

Fig. 4

IF : 10.7MHz     OSC FOR RADIO 108 OSCILLATION FREQUENCY : 37.8MHz

| AREA/BAND | BROADCAST SIGNAL FREQUENCY (MHz) | LOCAL FREQUENCY f_FMLO, f_AMLO (MHz) | VCO OSCILLATION FREQUENCY f_VCO (MHz) | FMLO, AMLO DIVIDING RATE K, M | DIVIDING RATE OF PLL DIVIDER N | REFERENCE FREQUENCY f_REF (MHz) | RECEIVING STEP. f_FMC. f_AMC (kHz) | DIVIDING RATE OF REFERENCE FREQUENCY |
|---|---|---|---|---|---|---|---|---|
| JAPAN FM | 76.000 – 90.000 | 65.300 – 79.300 | 195.900 – 237.900 | 3 | 1360 – 1586 | 150 | 50.00 | 252 |
| JAPAN AM (MW) | 0.531 – 1.620 | 11.231 – 12.320 | 202.158 – 221.760 | 18 | 11231 – 12320 | 18 | 1.00 | 2100 |
| NORTH AMERICA FM | 87.900 – 107.900 | 98.600 – 118.600 | 197.200 – 237.200 | 2 | 1972 – 2372 | 100 | 50.00 | 378 |
| NORTH AMERICA WEATHER | 162.400 – 162.550 | 173.100 – 173.250 | 173.100 – 173.250 | 1 | 6924 – 6930 | 25 | 25.00 | 1512 |
| NORTH AMERICA AM (MW) | 0.520 – 1.710 | 11.220 – 12.410 | 201.960 – 223.380 | 18 | 11220 – 12410 | 18 | 1.00 | 2100 |
| EUROPE FM | 87.500 – 108.00 | 98.200 – 118.700 | 196.400 – 237.400 | 2 | 1964 – 2374 | 100 | 50.00 | 378 |
| EAST EUROPE FM | 64.000 – 74.000 | 53.300 – 63.300 | 159.900 – 189.900 | 3 | 1066 – 1266 | 150 | 50.00 | 252 |
| LONG WAVE/ INTERMEDIATE WAVE | 0.144 – 1.710 | 10.844 – 12.410 | 195.192 – 223.380 | 18 | 10844 – 12410 | 18 | 1.00 | 2100 |
| SHORT WAVE 1 | 3.900 – 4.000 | 14.600 – 14.700 | 219.000 – 220.500 | 15 | 14600 – 14700 | 15 | 1.00 | 2520 |
| SHORT WAVE 2 | 5.700 – 6.300 | 16.400 – 17.000 | 196.800 – 204.000 | 12 | 16400 – 17000 | 12 | 1.00 | 3150 |

RADIO RECEIVER, AUDIO SYSTEM, AND METHOD OF MANUFACTURING RADIO RECEIVER

BACKGROUND

1. Field of the Invention

This invention relates to a radio receiver which receives at least a Frequency Modulation (FM) broadcast signal and demodulates the FM broadcast signal by digital signal processing.

2. Description of Related Art

Recently, digitization of signal processing of an FM/AM car-radio receiver has become popular with getting high-performance and high efficiency of multipath compliant and electrical noise rejection, and improving disturbing features by removing adjacent channel disturbing. For example, techniques or products related to radio reception by digital signal processing are described in "TDA7580" Data Sheet, STMicroelectronics, 2007 (non patent document 1), "SAF7730HV", Philips Semiconductors, Car Stereo Designer's Guide 2004/2005, order # 9397 750 13849, p. 29, September 2004 (non patent document 2), and "Symphony™ Digital Radio Introduction", Product Preview, p. 18 and 26, Freescale Semiconductor, Inc., SYMPHONYCHPSET/D Rev. 0, January 2003 (non patent document 3).

The product "TDA7580" of STMicroelectronics Company described in the non patent document 1 is a digital signal processor (DSP) in which an analog IF signal converted into IF (Intermediate Frequency) band from RF (Radio Frequency) band by external analog front end (AFE) module is received and performs digital demodulation is performed by digital sampling. That is, in the product described in the non patent document 1, a digital circuit (TDA7580) which performs digital demodulation of the IF signal is isolated from an analog circuit (AFE module) which performs RF-IF conversion.

Further, the DSP product "TDA7580" described in the non patent document 1 incorporates an oscillation circuit which oscillates in synchronization with an external crystal oscillator of 74.1 MHz, and generates an operation clock for digital signal processing and supplies a reference clock (for FM: 100 kHz, for Europe AM: 18 kHz) to AFE module.

The product "SAF7730HV" of Philips Semiconductors Corporation described in the non patent document 2 is an in-car DSP. The DSP described in the non patent document 2 as well as the one described in the above-described the non patent document 1 in which an analog IF signal supplied by external AEF module is input performs digital demodulation by digital sampling. Therefore, in the product described in the non patent document 2, a digital circuit (SAF7730HV) which performs digital demodulation of IF signal is isolated from an analog circuit which performs RF-IF conversion.

Further, the DSP product "SAF7730HV" described in the non patent document 2 incorporates an oscillation circuit which oscillates in synchronization with an external crystal oscillator of 41.6 MHz, and generates an operation clock for digital signal processing.

The product of Freescale Semiconductor Corporation described in the non patent document 3 includes an RF front end IC "SDR510100", which converts FM/AM broadcast signal into an analog IF signal by RF-IF conversion, and outputs the analog IF signal, and an IF analog interface IC "SDR530100", which receives the analog IF signal, and performs digital demodulation processing by digital sampling. Therefore, in the product described in the non patent document 3, a digital circuit (IF analog interface IC) which performs digital demodulation of IF signal is isolated from an analog circuit (RF front end IC) which performs RF-IF conversion.

Further, the IF analog interface IC "SDR530100" described in the non patent document 3 incorporates an oscillation circuit which oscillates in synchronization with an external crystal oscillator of 28.8 MHz, and generates an operation clock for digital signal processing and supplies a reference clock (7.2 MHz) to RF front end IC "SDR510100".

Japanese Unexamined Patent Application Publication No. 9-93149 (patent document 1) discloses the technique which restrains a poor reception when FM airwaves are received according to an FM multiplex broadcasting receiver. FIG. 7 is a block diagram showing an FM multiplex broadcasting receiver described in the patent document 1. In FIG. 7, many parts of an FM receiver 1 are constructed by an analog circuit and the FM receiver 1 receives FM airwaves and demodulates an FM multiplex broadcast signal which is a multiple digital signal. A detection part 2 detects existence or nonexistence of receiving of FM airwaves from the FM receiver 1. The FM multiplex broadcast signal which is obtained by demodulation processing of the FM receiver 1 is input into a main controller 3, and the main controller 3 performs error correction, displays information processing for a display device, and so on. A clock controller 4 generates a clock signal supplied to the main controller 3. Further, the clock controller 4 decreases a frequency of a clock signal corresponding to the detection result of the detection-part 2 when the FM receiver 1 receives the FM airwaves. This restrains a poor reception of FM airwaves due to an interference of the clock signal.

The patent document 1 takes note that, although the main controller 3 which is a digital circuit does not operate very fast, the main controller 3 can receive the digital signal of FM multiplex broadcasting because the transfer rate of the digital signal is low (for example, 16 kbit/s).

The receiver which demodulates an FM broadcast signal by digital signal processing has a problem that an electromagnetic wave which radiates from the digital circuit becomes an interference wave corresponding to the FM broadcast signal of high-frequency wave, by the frequency of an operation clock of the digital circuit which performs digital signal processing or harmonic frequency thereof being superimposed to FM broadcast band. Not only direct radiation from an oscillation circuit which supplies a clock signal to the digital circuit but also generation of current synchronized with the clock signal, specifically, radiation of an electrical field which is due to the current flowing between a power supply (VDD) and a ground (GND) often become the interference wave.

The case that the receiver receives the FM broadcast signal will be described. The FM broadcast band of all over the world is the following: from 76.0 MHz to 90.0 MHz in Japan, from 87.5 MHz to 108.0 MHz in Europe, from 87.9 MHz to 107.9 MHz in North America, and from 65.0 MHz to 74.0 MHz in East Europe. Therefore, in the case where the operating frequency of the digital circuit or the harmonic frequency thereof are superimposed to the FM broadcast bands, a tremendous interference is possibly generated for the reception of the FM broadcast wave of a specific frequency.

As described above, controlling for decreasing the frequency of the clock signal of the digital circuit when the receiver receives the FM multiplex broadcasting is described in the patent document 1. However, in the case where the digital signal processing is applied to the reception of the signal (FM broadcast signal) of an analog broadcast of an FM radio, lowering the frequency of the clock signal leads to a decrease in performance of the signal processing. That is, it would be substantially impossible to achieve the performance because a reception processing of the FM broadcast signal may not be performed by decreasing the frequency of the clock signal.

In the case of the non patent document 1, as the operating frequency of the digital circuit is 74.1 MHz, there is only a difference of 100 kHz between the operating frequency and an upper limit frequency of 74.0 MHz of an FM broadcast band of East Europe. Therefore, an electromagnetic wave radiated from the digital circuit may become the interference when the receiver receives the FM broadcast signal of 74.0 MHz.

In the case of the non patent document 2, as the operating frequency of the digital circuit is 41.6 MHz, the frequency of 83.2 MHz of the secondary harmonic wave of the operating clock is superimposed to the FM broadcast band of Japan. Therefore, an electromagnetic wave radiated from the digital circuit may become an interference when the receiver receives the FM broadcast signal in the proximity of 83.2 MHz.

In the case of the non patent document 3, as the operating frequency of the digital circuit is 28.8 MHz, the frequency of 86.4 MHz of the third harmonic wave of the operating clock is superimposed to the FM broadcast band of Japan. Therefore, an electromagnetic wave radiated from the digital circuit may become the interference when the receiver receives the FM broadcast signal in the proximity of 86.4 MHz.

As described above, the products which demodulate the FM broadcast signal by the digital signal processing cannot avoid interference which is due to the operating frequency of the digital circuit itself or harmonic frequency being superimposed to the FM broadcast band. Therefore, in general, to prevent certainly that an electromagnetic wave from the digital modulator restrains to interfere in the AFE module, the radio receiver employs the construction that the AFE module is arranged away from the digital modulator and an IC including the digital demodulator or an IC including the AFE module or both of them are covered with a shielded member which blocks an electromagnetic wave.

For the purpose of reference, FIG. 8 shows a configuration example of an in-car audio equipment for car mounted with a conventional radio receiver. In FIG. 8, a signal which has an RF band and is received by an antenna 100 is input into an RF-IF converter 101. Then the RF-IF converter 101 selects a desired channel by adjusting a local frequency generated by a frequency synthesizer (not shown), and converts the selected signal into an analog IF signal of 10.7 MHz, for example, and outputs it. In the example of FIG. 8, a reference frequency of the frequency synthesizer which the RF-IF converter 101 includes is supplied from an IF demodulator 107 which is described later.

The IF demodulator 107 takes a digital sample of an analog IF signal which is supplied from the RF-IF converter 101, performs a digital demodulation processing, and outputs a stereo audio signal (an L signal and an R signal) Further, the IF demodulator 107 has an oscillation circuit (not shown) which oscillates in synchronization with an oscillator (an OSC for radio) 108 for a radio receiver connected to the IF demodulator 107, and performs the digital signal processing using a clock signal output by the oscillation circuit, or a multiplied clock of it, as an operation clock. Furthermore, the IF demodulator 107 generates a reference clock signal (reference frequency f_REF) by dividing an output of an oscillation circuit (not shown) synchronized with the OSC for radio 108 and supplies the reference clock signal to the frequency synthesizer which the RF-IF converter 101 includes.

An audio signal processor 110 is a so-called "DSP", which performs a digital audio signal processing such as a correction of volume level or frequency equalizing with respect to a digital audio signal supplied from the IF demodulator 107, a semiconductor memory processor 113, an optical disk processor 114, and so on. The audio signal which is processed by the audio signal processor 110 is digital-analog converted and is supplied to an amplifier 112, and is output from a speaker 118.

An OSC for audio 111 is an oscillator for digital audio signal processing. The audio signal processor 110 has an oscillator circuit (not shown) synchronized with the oscillator for audio (OSC for audio) 111, and performs a digital audio signal processing using the clock signal which the oscillation circuit outputs, or the multiplied clock of it, as an operation clock.

The semiconductor memory processor 113 reads out an audio file stored in a semiconductor memory 131, and supplies the digital audio signal to the audio signal processor 110.

An optical disk processor 114 reads out a digital audio signal stored in an optical disk 132, and supplies it to the audio signal processor 110.

A main controller 115 performs complete control of the in-car audio equipment. An oscillator for the system (OSC for system) 116 is an oscillator which supplies an operation clock to the main controller 115.

A display controller 117 controls a display of a display device 133. Frequency of an FM broadcast channel currently being tuned is shown in the display device 133, for example.

In the in-car audio device of FIG. 8, the AFE part including the RF-IF converter 101 is implemented on a sub substrate 122, and a digital circuit part which is a latter part of IF demodulator 107 is implemented on a main substrate 123 which is outside the sub substrate 122. Further, connecting the sub substrate 122 and a digital signal processing module of the main substrate 123 after making the sub substrate 122 implemented as the AFE part to be a tuner module having a metal shield structure, can prevent a clock signal generated by three kinds of oscillators (OSC for radio 108, OSC for audio 111, and OSC for system 116) described above from influencing a high-frequency circuit which is a latter part of an antenna 100, that is, the RF-IF converter 101.

SUMMARY

Note that, a technique of integrating the RF-IF converter 101 and the IF demodulator 107 which the radio receiver includes and configuring them as one tuner module is commonly performed in the analog radio receiver. However, in the digital radio receiver which demodulates the FM broadcast signal by digital signal processing, it is impossible to employ this configuration because an electromagnetic wave radiated from components relevant to the digital signal processing of the IF demodulator 107, such as the OSC for radio 108 or the oscillation circuit (not shown) which oscillates and synchronizes with it, interferes in the FM broadcast signal. That is, because an interference of reception occurs in the radio receiver which demodulates by digital signal processing, the configuration which is general to the analog radio receiver cannot be applied, and it has a problem that a flexibility of implementation is small.

A first exemplary aspect of an embodiment of the present invention is a radio receiver which performs a demodulation processing of an FM broadcast signal by a digital signal processing. The radio receiver includes a frequency converter, an oscillation circuit, an A/D converter, and a digital demodulator. The frequency converter converts the FM broadcast signal into an intermediate frequency signal. The oscillation circuit oscillates a clock signal. The A/D converter digitally samples the intermediate frequency signal by using one of an oscillating frequency of the clock signal, a multiplying frequency of the clock signal, and a dividing frequency of the clock signal as a sampling frequency. The digital demodulator performs a digital demodulation processing by using the intermediate frequency signal digitally sampled and by using one of an oscillating frequency of the clock signal, a multiplying frequency of the clock signal, and a dividing frequency of the clock signal as an operating frequency. The oscillating frequency is within a predetermined range. The predetermined range is at least one of equal to or more than 37.1 MHz and less than or equal to 37.9 MHz, equal to or more than 54.1 MHz and less than or equal to 64.8 MHz, and equal to or more than 74.2 MHz and less than or equal to 75.8 MHz.

By choosing the oscillation frequency of the clock signal as described above, the frequency does not conflict with any FM broadcast bands used in the world and is away from 200 kHZ or more. Therefore, in contrast to the operation frequencies described in the non patent documents 1-3, the electromagnetic wave radiated from the digital demodulator does not conflict with any FM broadcast signal. Thus, for example, the above constitution which is common with the analog radio receiver can be employed. That is, the frequency converter, the oscillation circuit, the A/D converter, and the digital demodulator are able to be housed in a common package which has a shield construction for the electromagnetic wave.

Further, unlike the non patent document 1, the radio receiver of the first exemplary aspect of an embodiment of the present invention does not need to decrease the operation frequency of the digital signal processing during reception of the FM broadcast signal.

A second exemplary aspect of an embodiment of the present invention is a method for manufacturing a radio receiver which performs demodulation processing by digital signal processing. The method includes the steps (a) to (e).
(a) Arranging a frequency converter that converts an FM broadcast signal into an intermediate frequency signal.
(b) Arranging an oscillation circuit that oscillates a clock signal.
(c) Arranging an analog/digital (A/D) converter that digitally samples the intermediate frequency signal by using one of an oscillating frequency of the clock signal, a multiplying frequency of the clock signal, and a dividing frequency of the clock signal as a sampling frequency.
(d) Arranging a digital demodulator that performs a digital demodulation processing by using the intermediate frequency digitally sampled and by using one of an oscillating frequency of the clock signal, a multiplying frequency of the clock signal, and a dividing frequency of the clock signal as an operating frequency.
(e) Selecting a frequency of the clock signal so that the frequency of the clock signal and a harmonic frequency of the clock signal do not conflict with an FM broadcast band including the FM broadcast signal and the frequency of the clock signal and the harmonic frequency of the clock signal are away from the FM broadcast band by equal to or more than 200 kHz.

By using the manufacturing method according to the second exemplary aspect of an embodiment of the present invention, the radio receiver which can reduce the possibility of the electromagnetic wave radiated from the digital demodulator becoming the interference wave of the FM broadcast signal can be manufactured. Therefore, for example, the above construction which is common to an analog radio receiver, that is, the frequency converter, the oscillation circuit, the A/D converter, and the digital demodulator, can be housed in a common package which has shield structures for the electromagnetic wave.

According to the aspects of the embodiments of the present invention, in the radio receiver which performs the demodulation of the FM broadcast signal by digital signal processing, it is possible to reduce the possibility of the electromagnetic wave radiated from the digital circuit, which performs the digital demodulation processing, becoming the interference wave of the FM broadcast signal. Further, the aspects of the embodiments of the present invention can arrange the analog front end which performs RF-IF conversion and the digital circuit which performs digital demodulation processing proximally. Therefore, the design freedom can be improved.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4 is a reference chart showing switching examples of a reference frequency f_REF;

DETAILED DESCRIPTION OF THE EXEMPLARY EMBODIMENTS

Figure 1:
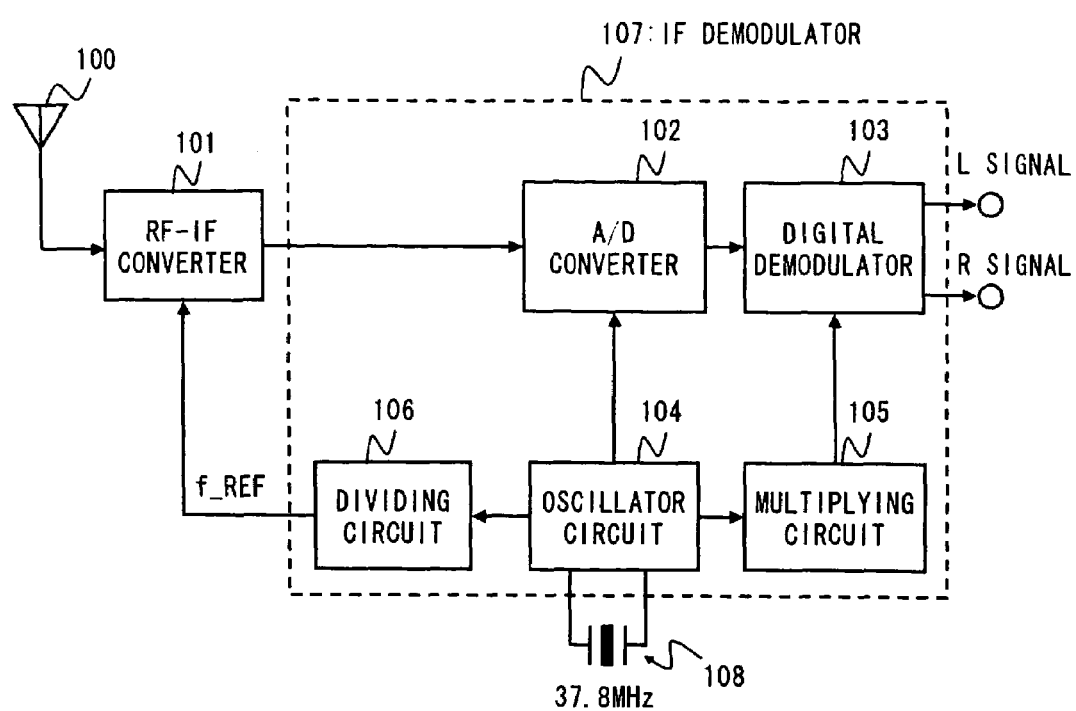
FIG. 1 is a block diagram showing a configuration example of a radio receiver according to a first exemplary embodiment of the invention.

An exemplary embodiment of the present invention is described hereinafter in detail with reference to the drawings. In each drawing, same reference numerals are applied to the same components, and an overlapping explanation will be omitted as necessary for keeping the explanation shorter.

First Exemplary Embodiment

<1. Configuration of a Radio Receiver According to the First Exemplary Embodiment>

FIG. 1 is a block diagram showing a radio receiver according to the first exemplary embodiment. In FIG. 1, an antenna 100, an RF-IF converter 101, an IF demodulator 107, and an OSC for radio 108 are the same as above ones shown in FIG. 8. One of the features of the radio receiver of the exemplary embodiment is that the frequency of the OSC for radio 108 is set at 37.8 MHz. On the premise of the explanation of an affectivity of this selected frequency, a detailed configuration example and an operation of the RF-IF converter 101 and the IF demodulator 107 will be described hereinafter.

A configuration and an operation of the IF modulator 107 will be described in reference to FIG. 1. An A/D converter 102 takes a digital sample of an analog IF signal (A/D conversion) supplied from the RF-IF converter 101, and generates a digital IF signal. The sampling rate of the analog IF signal by the A/D converter 102 is decided depending on a clock supplied by the oscillator circuit 104.

An IF signal digitized by the A/D converter 102 is input into a digital demodulator 103. The digital demodulator 103 performs a radio detection processing, an audio band processing, and a denoising processing for the digital IF signal, and outputs a stereo audio signal (L signal and R signal).

The oscillator circuit 104 generates a clock signal synchronized with the natural frequency of the OSC for radio 108 arranged outside of the IF demodulator 107.

A multiplying circuit 105 generates a high-speed clock signal by multiplying a clock generated by the oscillator circuit 104 and supplies it to the digital demodulator 103. The digital demodulator 103 uses the high-speed clock output by the multiplying circuit 105 as an operation clock, and performs a digital demodulation processing.

A dividing circuit 106 generates a low-speed clock signal by dividing a clock generated by the oscillator circuit 104 and supplies the low-speed clock as a reference clock signal of reference frequency f_REF to the RF-IF converter 101. This reference clock signal is used for generating a local frequency in a frequency synthesizer 200 (shown in FIG. 2) included in the RF-IF converter 101.

Figure 2:
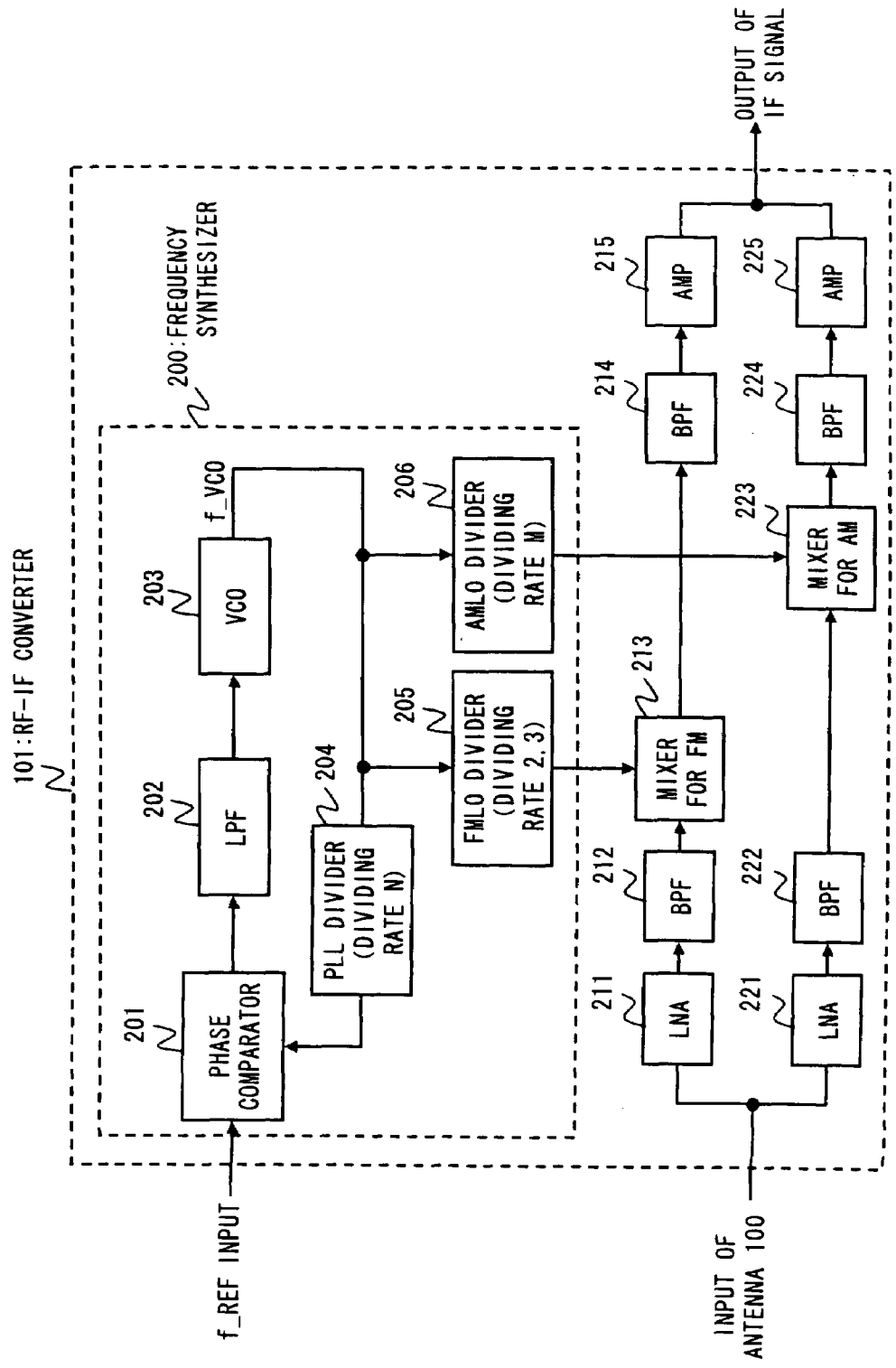
FIG. 2 is a block diagram showing a configuration example of an RF-IF converter according to the first exemplary embodiment of the invention.

Next, hereinafter an exemplary configuration of the RF-IF converter 101 which converts an FM broadcast signal received in the antenna 100 into an analog IF signal will be described. FIG. 2 is a block diagram showing one exemplary configuration of the RF-IF converter 101.

In FIG. 2, the reference clock signal of the reference frequency f_REF is input into the frequency synthesizer 200, and the frequency synthesizer 200 generates a local frequency f_FMLO for IF conversion of an FM broadcast signal and a local frequency f_AMLO for IF conversion of an AM broadcast signal. A signal of local frequency f_FMLO generated by the frequency synthesizer 200 is supplied to a mixer for FM 213 functioning as a converter for IF band of the FM broadcast signal. A signal of local frequency f_AMLO is supplied to a mixer for AM 223 functioning as a converter for the IF band of the AM broadcast signal.

Further, in the example of FIG. 2, a low-noise amplifier 211 and a band pass filter 212 for selecting an FM broadcast band are arranged to a former stage of a mixer for FM 213. A band pass filter 214 for selecting an IF signal and an amplifier 215 are arranged to a latter stage of a mixer for FM 213. Similarly, a low-noise amplifier 221 and a band pass filter 222 for selecting AM broadcast band are arranged to a former stage of a mixer for AM 223. A band pass filter 224 for selecting an IF signal and an amplifier 225 are arranged to a latter stage of a mixer for AM 223. Note that, the configurations of the former and the latter stages of the mixer for FM 213 and the mixer for AM 223 will be not limited to these particularly, and the arrangements of the amplifier and filter can be selected arbitrarily.

The frequency synthesizer 200 is constructed as a PLL (Phase Locked Loop), as shown in FIG. 2, for example. Specifically, a phase comparator 201, a low pass filter 202, a voltage controlled oscillator (VCO) 203, and a PLL divider 204 configure a PLL, and the PLL generates a clock signal whose frequency is an N-th of the reference frequency f_REF. Here, N is a dividing rate of the PLL divider 204.

The FMLO divider 205 generates a signal whose frequency is f_FMLO by dividing an output of the VCO 203 whose frequency is f_VCO. Further, an AMLO divider 206 generates a signal whose frequency is f_AMLO by dividing an output of the VCO 203 whose frequency is f_VCO.

The local frequencies f_FMLO and f_AMLO which are output from the frequency synthesizer 200, of course, need to be adjusted so as to accord the difference between these and the frequency of the FM broadcast signal or AM broadcast signal, and an intermediate frequency. For example, in the case where the frequency of the FM broadcast signal received is 80 MHz and the intermediate frequency is 10.7 MHz, the local frequency f_FMLO is adjusted into 80.0+10.7 MHz or 80.0−10.7 MHz. One frequency which does not overlap the FM broadcast band out of the upper side (for example, 90.7 MHz) and the lower side (for example, 69.3 MHz) of the frequency of the FM broad cast signal may be selected as the local frequency f_FMLO.

An oscillation frequency of the VCO 203 which is a "generation mother" of the local frequencies f_FMLO and f_AMLO is generally set in the range from 100 MHz to 200 MHz in order to receive the FM broadcast signal. In order to respond to both of an FM broadcast band which is relatively low, as in Japan and East Europe, and an FM broadcast band which is relatively high, such as North America and Europe, with one frequency synthesizer 200, the output of the VCO 203 is utilized by dividing. For example, if an oscillation frequency f_VCO is around 200 MHz, the receiver can cover an FM broadcast band all over the world by using frequencies divided by two or three.

By the way, in the case where the receiver receives the AM broadcast signal, in order to use the oscillation frequency f_VCO which is common to the FM broadcast signal and use an intermediate frequency (for example, 10.7 MHz) which is same as the FM broadcast signal, the local frequency f_AMLO for AM becomes quite low. For example, in the case where a reception frequency of the AM broadcast signal is 999 kHz and the intermediate frequency is 10.7 MHz, the local frequency f_AMLO needs to be set at 10.7+0.999 MHz or 10.7−0.999 MHz. That is, the local frequency f_AMLO becomes a single digit lower than the local frequency f_FMLO.

Therefore, in order to share the frequency synthesizer 200 with the FM broadcast reception and an AM broadcast reception, f_VCO has to be set at around 200 MHz, and a dividing rate M of the AMLO divider 206 is set approximately from 10 to 20. This can generate the local frequency f_AMLO which can cover each AM broadcast of a medium wave (MW), short wave (SW), and long wave (LW) all over the world.

Note that one of the features of the exemplary embodiment is the relation between the dividing rate of the PLL divider 204, FMLO divider 205, AMLO divider 206, which are included in the frequency synthesizer 200, and the reference frequency f_REF which is input into the frequency synthesizer 200. This point will be described after explanation of selection of the oscillation frequency of the OSC for radio 108.

<2. Selection Method of an Oscillation Frequency which Does Not Conflict with an FM Broadcast Band>

Next, an optimum selection of an oscillation frequency of the OSC for radio 108 will be described in detail. The first condition which is desired for the oscillation frequency of the OSC for radio 108 connected to the oscillator circuit 104 which the IF demodulator 107 includes is that a frequency which is supplied to the A/D converter 102 is a sufficient sampling frequency in the conduct of digital demodulating as against typical intermediate frequency (for example, 10.7 MHz). The second condition is that it is desirable that the oscillation frequency is as low as possible from the view point of reduction of power consumption of the A/D converter 102 and the digital demodulator 103. The third condition is that the oscillation frequency of the OSC for radio 108 and the harmonic frequency thereof are not overlapped with the FM broadcast band all over the world and the oscillation frequency is at least 200 kHz away from the FM broadcast band. Note that, because the FM broadcast signal has a spread of approximately ±75 kHz with respect to a channel center frequency, the oscillation frequency is 200 kHz away from the FM broadcast band. Therefore, it is appropriate that a guard band for avoiding interference is set to about 200 kHz. The frequencies which meet these first to third conditions will be described with reference of FIG. 3.

<First Choice>

The first choice of the oscillation frequency of the OSC for radio 108 for satisfying the first to third conditions described above is within the range from 37.1 MHz to 37.9 MHz. For example, in the case where the IF signal frequency is 10.7 MHz, if the oscillation frequency of the OSC for radio 108 is selected from the range of from 37.1 MHz to 37.9 MHz, the oscillation frequency is approximately quadruple of the IF signal frequency. Therefore, as a sufficient clock to take a digital sample of an analog IF signal can be supplied to the A/D converter 102, the above first condition will be met.

Figure 3:
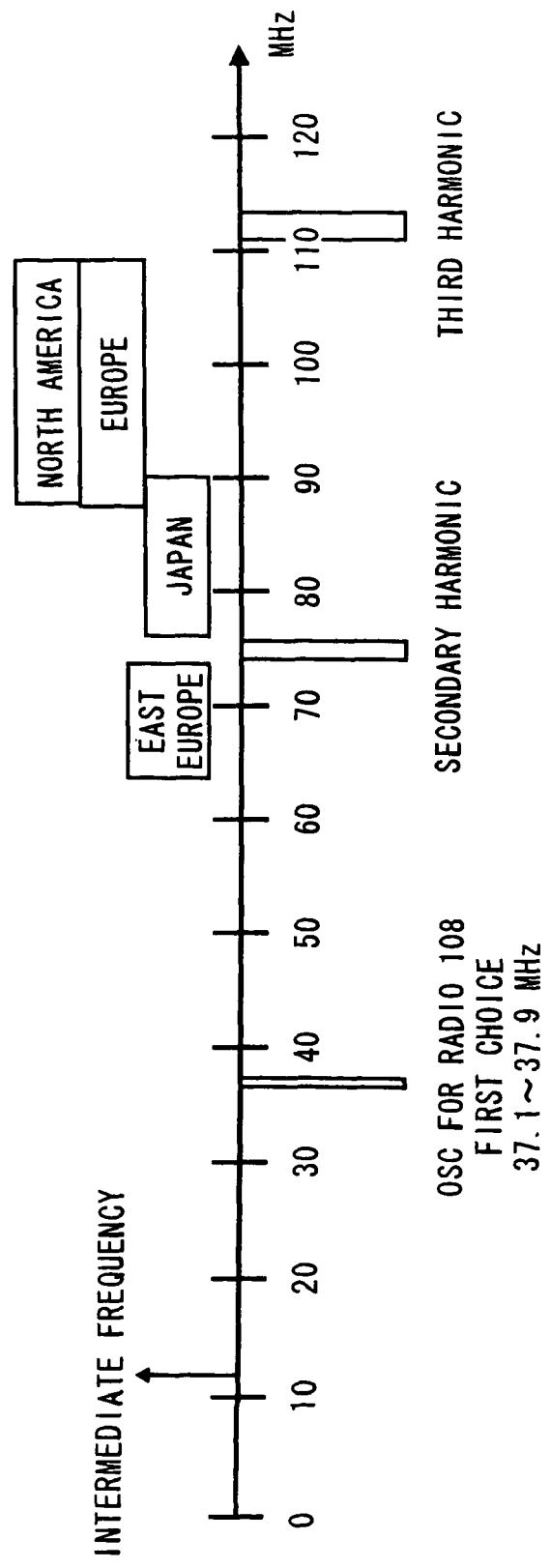
FIG. 3 is a view showing a relation between an intermediate frequency, and a first choice and a harmonic thereof of an oscillation frequency of an OSC for a radio.

Further, if the oscillation frequency of the OSC for radio 108 is within the range from 37.1 MHz to 37.9 MHz, as shown in FIG. 3, frequencies of a secondary harmonic thereof from 74.2 MHz to 75.8 MHz are between the upper limit frequency of East Europe band (74.0 MHz) and the lower limit frequency of the Japan band (76.0 MHz) and are away from each of them by at least 200 kHz. Therefore, an occurrence of a pseudo adjacent station disturbance can be restrained. Further, since frequencies of a third harmonic of from 111.3 MHz to 113.7 MHz are away from an upper limit frequency of the Europe band (108.0 MHz) by equal to or more than 3 MHz, the third harmonic does not become a disturbing wave for the Europe band. A fourth or more harmonic is similar. That is, the range of from 37.1 MHz to 37.9 MHz meets also the second and third conditions described above.

Additionally, there is a possibility that any frequency which is equal to or less than 37.0 MHz will become the disturbing wave for the FM broadcast signal, because the harmonic frequency thereof overlaps with any of the FM broadcast bands of all over the world.

<Second Choice>

The second choice of the oscillation frequency of the OSC for radio 108 for satisfying the first to third conditions described above is within the range from 54.1 MHz to 64.8 MHz. For example, in the case where the frequency of the IF signal is 10.7 MHz, if the oscillation frequency of the OSC for radio 108 is selected from the range from 54.1 MHz to 64.8 MHz, the oscillation frequency is approximately quintuple or sixfold of the IF signal frequency. Therefore, as it can be supplied sufficient clocks to take a digital sample of an analog IF signal to the A/D converter 102, the above first condition will be met. Further the frequencies of a second harmonic which are from 108.2 MHz to 129.6 MHz are away from an upper limit frequency of Europe band (108.0 MHz) by at least 200 kHz. The frequencies which are more than third harmonic are same. That is, the range of from 54.1 MHz to 64.8 MHz meets also the second and third conditions described above.

<Third Choice>

The third choice of the oscillation frequency of the OSC for radio 108 for satisfying the first to third conditions described above is within the range of from 74.2 MHz to 75.8 MHz. This is equal to the frequency range of the second harmonic of the first choice described above. However, in the case where the frequency of the IF signal is 10.7 MHz, the frequency of the third choice becomes high-frequency which has more than septuplicate frequencies of the IF signal frequency. Further, in the degree of the interference for the FM broadcast signal, the interference of a direct wave is larger than that of the harmonic. Considering these things, although the frequencies of the third choice are available, it is more desirable to use the first choice and the second choice. Note that, if the power consumption is reduced and the electromagnetic interference is further reduced by reducing the operation clock frequency of the oscillator circuit 104 to less than half, then the values of the method of the third choice and the first choice described above are equivalent.

<Fourth Choice>

The fourth choice of the oscillation frequency of the OSC for radio 108 for satisfying the first to third conditions described above is equal to or more than 108.2 MHz. If the oscillation frequency is selected as a higher frequency than the FM broadcast band used anywhere in the world, the interference for the FM broadcast signal can be reduced. However, in the case where the frequency of the IF signal is 10.7 MHz, the frequency of the third choice becomes high-frequency which has more than decuple frequencies of the IF signal frequency. Therefore, it is necessary that the digital demodulator is designed to operate by a commensurate clock speed. Further, it is difficult to reduce the power consumption and the electromagnetic interference, because the frequency less than 108.2 MHz cannot be used. Considering these things, although the frequency of the forth choice is available, it is more desirable to use the frequencies of the first to third choices described above.

The multiplying clock signal generated by the multiplying circuit 105 which the clock signal having the frequency including the first to fourth choices described above is input into does not conflict with the FM broadcast band used anywhere in the world, and is separated from the band by more than 200 kHz. For example, in the case where the digital demodulator 103 is configured by a special circuit, the multiplying factor of the multiplying circuit 105 may be fine with a small value, for example, single. In other words, the multiplying factor is sometimes fine with the same frequency as an input clock signal supplied from the oscillator circuit 104. On the other hand, in the case where a universal circuit such as a DSP is used as the digital demodulator 103 and a digital demodulation is performed by running a program for signal processing calculated by the DSP, the multiplying factor of the multiplying circuit 105 needs a sufficient value to acquire a performance needed for the DSP. Therefore, for example, the multiplying factor sometimes needs more than several fold frequencies of the input clock supplied from the oscillator circuit 104.

<3. Selection Method of an Oscillation Frequency which is Suitable for FM/AM Channel Choice>

Above description was described about the frequency range which should be chosen to prevent the oscillation frequencies of the OSC for radio 108 and the oscillator circuit 104 from interference for the FM broadcast signal. Subsequently, it will be described what kind of number, specifically, what kind of divisors should be set to the oscillation frequencies of the OSC for radio 108 and the oscillator circuit 104.

As described above, the reference frequency f_REF generated by the dividing circuit 106 is used for the generation of the local frequencies f_FMLO and f_AMLO by the frequency synthesizer 200 which is included in the RF-IF converter 101. The local frequencies f_FMLO and f_AMLO which are mixed with an RF signal should be generated in high accuracy so as to be the difference between the FM broadcast signal and the local frequency f_FMLO and the difference between the AM broadcast signal and the local frequency f_AMLO become the intermediate frequency. Therefore, the reference frequency f_REF which becomes the reference signal of the frequency synthesizer 200 needs high accuracy. So, a jitter of the reference frequency f_REF is designed smaller than a specific jitter of the OSC for radio 108 by generating the reference frequency f_REF by dividing the output clock of the oscillator circuit 104.

The relation between the reference frequency f_REF generated by the dividing circuit 106, and the oscillation frequency f_VCO of the VCO 203 is described in the following expression (1). Note that, as described above, N is the dividing rate of the PLL divider 204.

$$f\_VCO = f\_REF \times N \quad (1)$$

Further, the local frequency for FM f_FMLO, and the local frequency for AM f_AMLO are described in the following expressions (2) and (3), wherein the dividing rate of the FMLO divider 205 is K, the dividing rate of the AMLO divider 206 is M.

$$f\_FMLO = f\_VCO/K = f\_REF \times N/K, (K=2 \text{ or } 3) \quad (2)$$

$$f\_AMLO = f\_VCO/M = f\_REF \times N/M \quad (3)$$

In cases where a channel is dialed by using the frequency synthesizer 200, it is general that the local frequencies f_FMLO or f_AMLO are changed with a channel interval unit of FM broadcast or AM broadcast by increasing or decreasing the dividing rate N of the PLL divider 204. For example, if the local frequencies f_FMLO and f_AMLO are changed by just a channel interval of the FM broadcast and AM broadcast respectively by changing the dividing rate N by ΔN, the reference frequency f_REF can be selected so as to satisfy to the following expressions (4) and (5). Here, f_FMC and f_AMC are channel intervals of FM broadcast and AM broadcast, respectively.

$$f\_FMC = \Delta f\_FMLO = f\_REF \times \Delta N/K, (K=2 \text{ or } 3) \quad (4)$$

$$f\_AMC = \Delta f\_AMLO = f\_REF \times \Delta N/M \quad (5)$$

Further, if expressions (4) and (5) are rewritten, then the expressions (6) and (7) are acquired.

$$f\_REF = f\_FMC \times K/\Delta N, (K=2 \text{ or } 3) \quad (6)$$

$$f\_REF = f\_AMC \times M/\Delta N \quad (7)$$

As is clear from the expressions (6) and (7), it is desirable that the reference frequency f_REF be a common multiple of the channel intervals f_FMC and f_AMC of FM broadcast and AM broadcast. Further, it is desirable that the reference frequency f_REF be a multiple number of the dividing rate of the FMLO divider 205 and the dividing rate of the AMLO divider 206. Specifically, as the channel interval (the smallest frequency interval of between broadcast stations) is 100 kHz, it is preferred that the reference frequency f_REF be a multiple number of 100 kHz. Further, as a channel interval of the AM broadcast in Japan is 9 kHz, it is preferred that the reference frequency f_REF be a multiple number of 9 kHz. Further, considering the FM broadcast, it is preferred that the reference frequency r_REF be a multiple of two or three. Furthermore, considering the AM broadcast, there is a possibility that the dividing rate M of the AMLO divider 206 becomes a various number in order to cover each AM broadcast which is a medium wave (MW), short wave (SW), and long wave (LW) anywhere in the world. Therefore, it is preferred that the reference frequency f_REF be a multiple of many integer numbers which has a possibility of becoming multiple of these various integer numbers.

However, the condition of the reference frequency f_REF described above is not prerequisite. That is because, if ΔN is set to a proper value which is more than one, there is no need to meet the condition of the reference frequency f_REF. This is equivalent to assuming that a channel interval is identified as 1/ΔN. For example, it means the following. That is, in the FM broadcast, if ΔN is two, the channel is tuned for every 50 kHz, and if ΔN is three, the channel is tuned for every 33.33 kHz. Thus, the frequency is tuned to the desired channel frequency in every timing when N is two steps or three steps.

It would be better for the reference frequency f_REF to be as large as possible in order to prompt speeding up of a convergence time of PLL which the frequency synthesizer 200 includes, and in order to be less subject to the influence of jitter. This can be restated that the dividing rate N of the PLL divider 204 should be as small as possible. Therefore, it is still desirable that the reference frequency f_REF can be set to ΔN=1 so as to tune the channel between the smallest channel interval of the FM broadcast and the AM broadcast.

Note that, it is possible to switch the reference frequency f_REF between the FM broadcast band and the AM broadcast band and to switch the reference frequency depending on each reception area by changing the dividing rate of the dividing circuit 106. FIG. 4 shows a changeover example of the reference frequency. In FIG. 4, the dividing rate of reference frequency shown in the rightmost column needs to be set as the dividing rate of the dividing circuit 106 of FIG. 1.

<4. Example of Preferred Oscillation Frequency>

As shown in FIG. 4, in order to change the reference frequency f_REF depending on frequency band of a broadcast signal and a reception area, it is necessary to get all reference frequencies f_REF which are shown in the list of FIG. 4 by dividing the generation clock of the oscillator circuit 104. In other words, the oscillation frequency of the OSC for radio 108 which is connected to the oscillator circuit 104 must be a common multiple of all reference frequencies f_REF shown in the list of FIG. 4.

By the above discussion of the reference frequency f_REF generated by the dividing circuit 106, it is desirable that the operating frequency of the digital demodulator 103 and the oscillation frequency of the OSC for radio 108 which decides a sampling rate of A/D converter are multiple numbers of a reception step, specifically, a channel frequency distance of a radiobroadcast (FM broadcast is 100 kHz, AM broadcast is 9 kHz or 10 kHz). Specifically, considering frequency bands which are used all over the world for FM broadcast and AM broadcast of long wave (LW), medium wave (MW) and short wave (SW), it is desirable that the oscillation frequency of the OSC for radio 108 is a multiple number of 900 kHz.

Further, it is preferable that the oscillation frequency of the OSC for radio 108 has many divisors in the range from 10 to 20 in order to take variable values as a dividing rate M of the local frequency which is used by the AMLO divider 206.

In the case where a range of from 37.1 MHz to 37.9 MHz, which is the first choice which meets the condition that does not conflict to the FM broadcast band of all over the world is employed, it is desirable that the oscillation frequency of the OSC for radio 108 is 37.8 MHz. That is because, 37.8 MHz is a multiple number of 900 kHz, and the number of 37,800,000 includes divisions which are integers between two and ten, and 12, 14, 15, 16, 18, 20 and 21. Therefore it has a wide range of choice as an integer dividing rate.

On the other hand, in the case where a range of from 54.1 MHz to 64.8 MHz, which is the second choice, is employed, 12 frequencies for each 900 kHz between 54.9 and 64.8 MHz as frequencies of multiple numbers of 900 kHz would be chosen as candidates of the oscillation frequency of the OSC for radio 108. Further, if one chooses the frequency having divisors of abundant integers among them, 56.7 MHz, which is one and a half times larger than 37.8 MHz, has many divisors as well as 37.8 MHz.

Further, in the case where a range of from 74.2 MHz to 75.8 MHz, which is the third choice, is employed, two frequencies which are 74.7 MHz and 75.6 MHz would be chosen as candidates as a multiple number of 900 kHz. Furthermore, if one chooses the frequency having divisors of abundant integers among them, 75.6 MHz, which is double of 37.8 MHz, has many divisors as well as 37.8 MHz.

<5. Modified Example of the if Demodulator 107>

Figure 5:
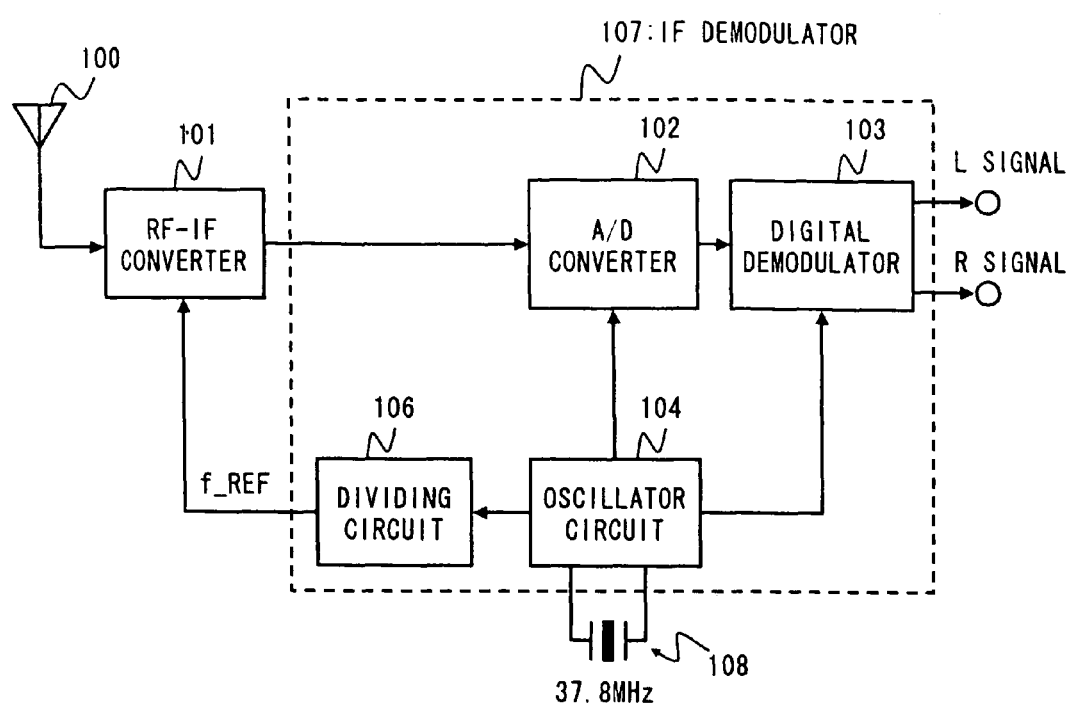
FIG. 5 is a block diagram showing another configuration example of the RF-IF converter.

The constitution of the IF demodulator 107 shown in FIG. 1 is one example. For example, if the digital demodulator 103 can perform a digital demodulation processing without using a dividing clock, the multiplying circuit 105 can be omitted. In this case, as shown in FIG. 5, it is only necessary that the clock signal of 37.8 MHz generated by the oscillator circuit 104 is directly supplied into the digital demodulator 103.

Further, in the case where the oscillator circuit 104 itself has a function of dividing the frequency by two or by 1.5, the oscillation frequency of the OSC for radio 108 connected to the oscillator circuit 104 may be set to 75.6 MHz which is double of 37.8 MHz which is the most preferable value of above discussion or 56.7 MHz, which is one and a half times larger than 37.8 MHz, and a frequency of a clock signal which is supplied to the A/D converter 102 and the digital demodulator 103 may be set to 37.8 MHz. Note that, even if these configuration are employed, the multiplying circuit 105 may be further arranged and an output of the oscillator circuit 104 may be divided by an arbitrary multiple number.

<6. The Effect of Choice of the Oscillation Frequency>

By choosing the oscillation frequency of the OSC for radio 108 among the first to fourth choices, in order to operate the A/D converter 102 and the digital demodulator 103, the clock signal supplied from the oscillator circuit 104 and the frequency of harmonic thereof do not conflict with any FM broadcast band all over the world, and are separated by at least 200 kHz. Therefore, in contrast to the operating frequency described in the non patent documents 1 to 3, the electromagnetic wave radiated from the digital demodulator 103 never interferes in the FM broadcast signal.

Further, if one chooses the oscillation frequency of the OSC for radio 108 from among the above first to fourth choices, as described in the non patent document 1, then it is not necessary to decrease the operating frequency of digital signal processing during receiving of the FM broadcast signal.

Further, it is not necessary to provide a plurality of oscillation circuits for generating a plurality of clock signals having different frequencies, for example, and the clock signal generated by one OSC for radio 108 and one the oscillator circuit 104 is shared for an RF-IF conversion of an analog front end, a digital sampling of an analog IF signal, and a digital demodulation of a digital IF signal.

Further the clock signal generated by one OSC for radio 108 and one oscillator circuit 104 may be shared with an audio processing such as a system processing, an acoustic processing, and a signal rate conversion from other devices. As a whole system such as the in-car audio device which is configured by using the radio receiver of the exemplary embodiment, this can reduce the influence for the reception of the FM broadcast signal.

Further, if one of 37.8 MHz, 56.7 MHz, and 75.6 MHz is employed as the oscillation frequency of the OSC for radio 108, then many local frequencies f_FMLO and f_AMLO which are needed for the reception of the FM broadcast and the AM broadcast of the long wave (LW), the medium wave (MW) and the short wave (SW) can be generated by supplying the reference frequency f_REF which is divided by an integer of this to the frequency synthesizer 200.

<7. Example of the Application to in-car Audio Device>

Further, need of measures of the electromagnetic interference by devising a layout of IC chip or wirings of a package or a circuit can be reduced by using the radio receiver of the exemplary embodiment described above. This can improve the freedom of constitutions of products such as an in-car audio device using the radio receiver.

Figure 6:
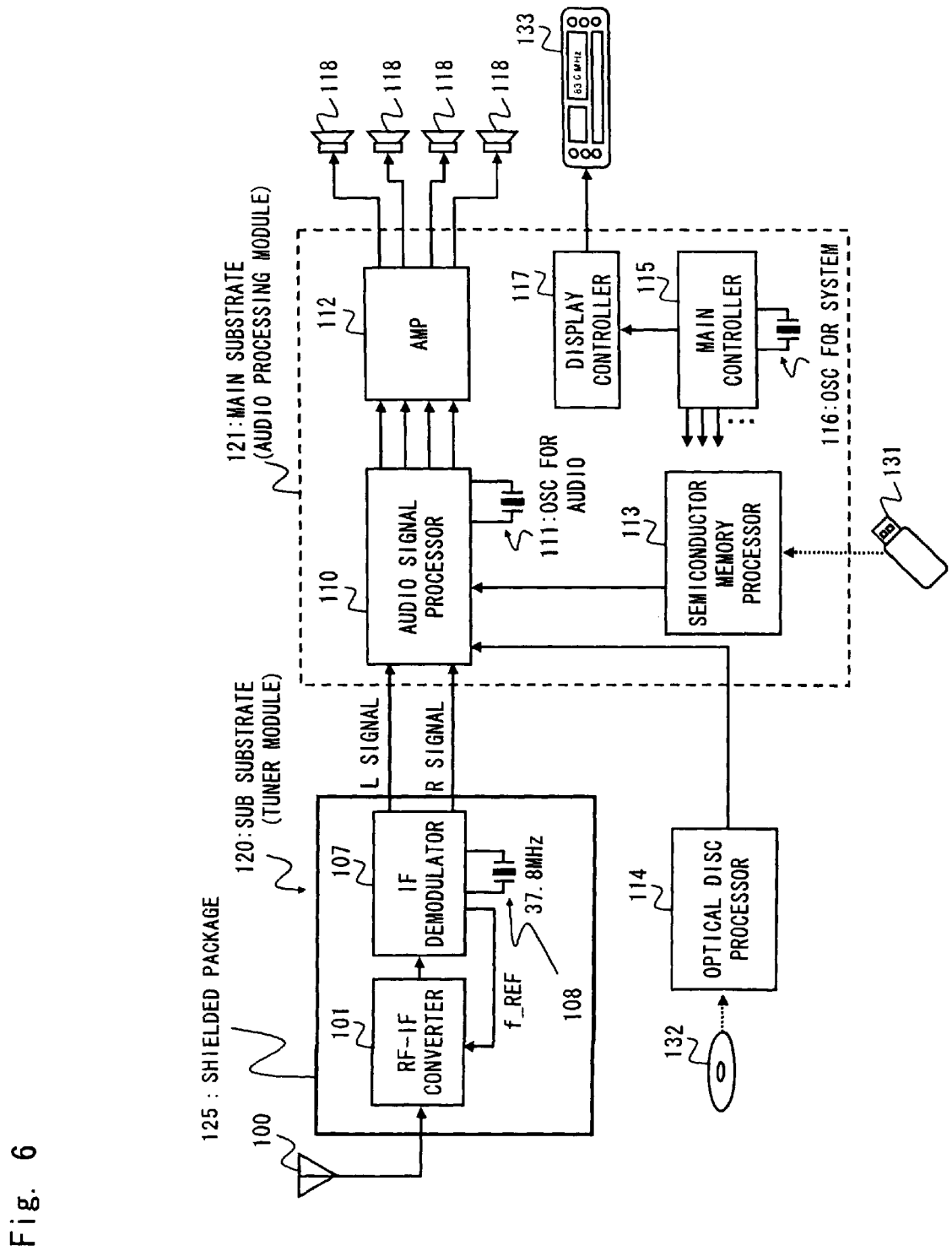
FIG. 6 is a block diagram showing a configuration example of an in-car audio device applying the radio receiver of the exemplary embodiment.
Figure 7:
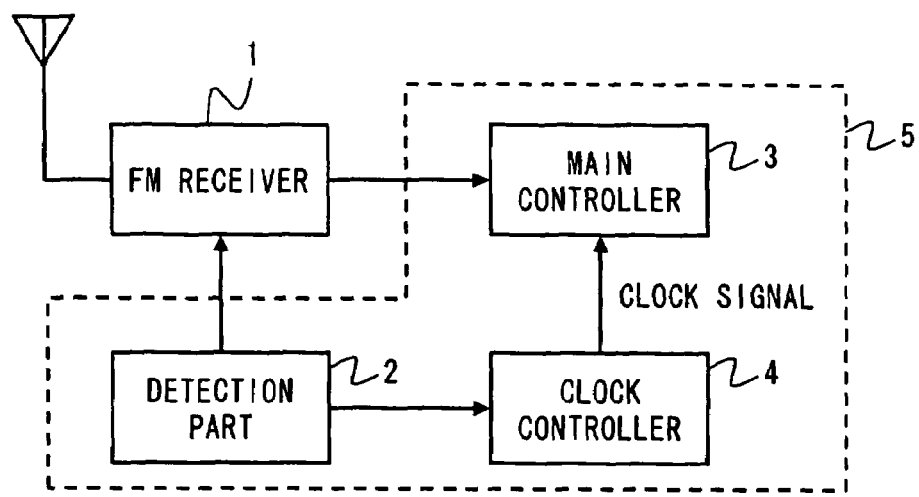
FIG. 7 is a block diagram showing an FM multiplex broadcasting receiver described in the patent document 1.

FIG. 6 is a block diagram showing an in-car audio device using the radio receiver of the exemplary embodiment. The difference between the in-car audio device of the exemplary embodiment and the in-car audio device of the related art shown in FIG. 8 is the oscillation frequency of the OSC for radio 108 and the arrangement of the IF demodulator 107.

Figure 8:
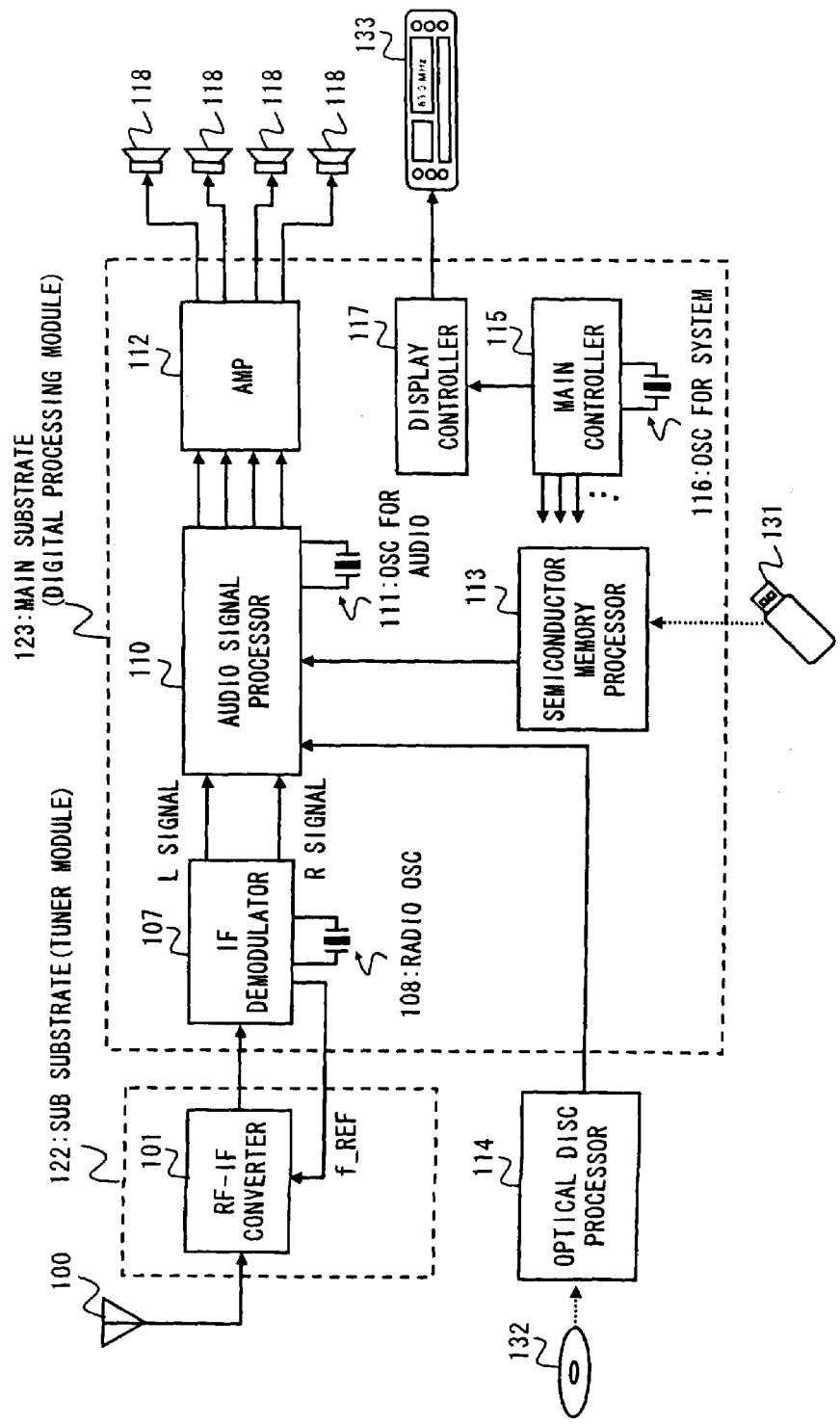
FIG. 8 is a block diagram showing a configuration example of an in-car audio device applying the radio receiver of the related art.

As described above, in the example of the related art shown in FIG. 8, to avoid electromagnetic interference, it is necessary that the IF demodulator 107 and the OSC for radio 108 which perform a digital sampling of an analog IF signal and a digital demodulation are arranged away from the RF-IF converter 101 and the RF-IF converter 101 is shielded. Therefore, the constitution of system would be constrained.

On the other hand, in the radio receiver of the exemplary embodiment, the interference of reception of the FM broadcast signal arising from the IF demodulator 107 and the OSC for radio 108 can be reduced by a perfect choice of the oscillation frequency of the OSC for radio 108. Therefore, as shown in FIG. 6, the RF-IF converter 101, and the IF demodulator 107, and the OSC for radio 108 can be implemented on a common sub substrate 120 without using a special shield member. Then, the sub substrate 120 can consist of a tuner module which is housed in a package (shielded package) 125 which has a metal shield configuration, and the sub substrate 120 can be connected to an audio processing module of the main substrate 121. This makes it possible for the RF-IF converter 101, the IF demodulator 107, and the OSC for radio 108 to form an integrated semiconductor circuit (IC) which is integrated in one semiconductor substrate. Further, the chip integrated RF-IF converter 101 and the chip integrated IF demodulator 107 and the OSC for radio 108 are integrated in three dimensions, and they are housed in the same IC package as a product.

As described above, the construction as shown in FIG. 6 which is same as the analog radio receiver of the related art can also be employed in the radio receiver which performs demodulation by digital signal processing by using the radio receiver of the exemplary embodiment.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A radio receiver performing a demodulation processing of an FM broadcast signal by a digital signal processing, the radio receiver comprising:

a frequency converter that converts the FM broadcast signal into an intermediate frequency signal;

an oscillation circuit that oscillates a clock signal;
an analog/digital (A/D) converter that digitally samples the intermediate frequency signal by using one of an oscillating frequency of the clock signal, a multiplying frequency of the clock signal, and a dividing frequency of the clock signal as a sampling frequency; and
a digital demodulator that performs a digital demodulation processing by using the intermediate frequency signal digitally sampled, by using the one of the oscillating frequency of the clock signal, the multiplying frequency of the clock signal, and the dividing frequency of the clock signal as an operating frequency,
wherein the oscillating frequency is within a predetermined range, the predetermined range is at least one of equal to or more than 37.1 MHz and less than or equal to 37.9 MHz, equal to or more than 54.1 MHz and less than or equal to 64.8 MHz, and equal to or more than 74.2 MHz and less than or equal to 75.8 MHz.

2. The radio receiver according to claim 1, wherein the digital demodulator comprises a digital signal processor and performs the digital demodulation processing by executing a program.

3. The radio receiver according to claim 1, further comprising a dividing circuit that generates a reference clock signal having a reference frequency by dividing the clock signal,
wherein the frequency converter includes a frequency synthesizer to generate a local frequency, the reference clock signal is input into the frequency converter, and the local frequency is used for a conversion into the intermediate frequency signal.

4. The radio receiver according to claim 1, wherein the oscillating frequency is 37.8 MHz.

5. The radio receiver according to claim 1, wherein the frequency converter, the oscillation circuit, the A/D converter, and the digital demodulator are housed in a common package, the package comprising a shield structure that shields an electromagnetic wave.

6. The radio receiver according to claim 1, wherein the oscillation circuit, the A/D converter, and the digital demodulator are integrated in one semiconductor substrate and form an integrated semiconductor circuit.

7. An audio system comprising:
a tuner module that is housed in a package, the package comprising a shield structure shielding an electromagnetic wave; and
an audio processing module that performs a signal processing of a digital audio signal supplied from the tuner module,
wherein the tuner module comprises:
a frequency converter that converts an FM broadcast signal into an intermediate frequency signal;
an oscillation circuit that oscillates a clock signal;
an analog/digital (A/D) converter that digitally samples the intermediate frequency signal by using one of an oscillating frequency of the clock signal, a multiplying frequency of the clock signal, and a dividing frequency of the clock signal as a sampling frequency; and
a digital demodulator that performs a digital demodulation processing by using the intermediate frequency signal digitally sampled and by using the one of the oscillating frequency of the clock signal, the multiplying frequency of the clock signal, and the dividing frequency of the clock signal as an operating frequency,
wherein the oscillating frequency is within a predetermined range, the predetermined range is at least one of equal to or more than 37.1 MHz and less than or equal to 37.9 MHz, equal to or more than 54.1 MHz and less than or equal to 64.8 MHz, and equal to or more than 74.2 MHz and less than or equal to 75.8 MHz.

8. The audio system according to claim 7, wherein the oscillation circuit, the A/D converter, and the digital demodulator are integrated in one semiconductor substrate, and form an integrated semiconductor circuit.

9. A method of manufacturing a radio receiver which performs demodulation processing by digital signal processing, the method comprising:
arranging a frequency converter that converts an FM broadcast signal into an intermediate frequency signal;
arranging an oscillation circuit that oscillates a clock signal;
arranging an analog/digital (A/D) converter that digitally samples the intermediate frequency signal by using one of an oscillating frequency of the clock signal, a multiplying frequency of the clock signal and a dividing frequency of the clock signal as a sampling frequency;
arranging a digital demodulator that performs a digital demodulation processing by using the intermediate frequency signal digitally sampled and by using the one of the oscillating frequency of the clock signal, the multiplying frequency of the clock signal, and the dividing frequency of the clock signal as an operating frequency; and
selecting a frequency of the clock signal so that the frequency of the clock signal and a harmonic frequency of the clock signal do not conflict with an FM broadcast band including the FM broadcast signal and the frequency of the clock signal and the harmonic frequency of the clock signal are separated from the FM broadcast band by at least 200 kHz.

10. The method of manufacturing a radio receiver according to claim 9, wherein the selecting selects a frequency as a frequency of the clock signal from among frequencies which do not conflict with the FM broadcast band including the FM broadcast signal and are separated from the FM broadcast signal by at least 200 kHz, and the frequency is a multiple of an adjacent channel distance of the FM broadcast band.

11. The method of manufacturing a radio receiver according to claim 10, wherein the selecting selects the frequency including a largest number of divisors of integers as the frequency of the clock signal.

12. The method of manufacturing a radio receiver according to claim 10, wherein the frequency converter, the oscillation circuit, the A/D converter, and the digital demodulator are housed in a common package, the package comprising a shield structure that shields an electromagnetic wave.

13. The method of manufacturing a radio receiver according to claim 10, wherein the oscillation circuit, the A/D converter, and the digital demodulator are integrated in one semiconductor substrate, and form an integrated semiconductor circuit.

* * * * *